(12) United States Patent
Konaka et al.

(10) Patent No.: US 9,087,929 B2
(45) Date of Patent: Jul. 21, 2015

(54) VARIABLE CAPACITANCE DEVICE

(71) Applicant: Murata Manufacturing Co., Ltd., Kyoto (JP)

(72) Inventors: Yoshihiro Konaka, Kyoto (JP); Toshiya Kawate, Kyoto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 14/249,890

(22) Filed: Apr. 10, 2014

(65) Prior Publication Data

US 2014/0217552 A1 Aug. 7, 2014

Related U.S. Application Data

(63) Continuation of application No. PCT/JP2012/066500, filed on Jun. 28, 2012.

(30) Foreign Application Priority Data

Nov. 8, 2011 (JP) .................................. 2011-244139

(51) Int. Cl.
*H01L 29/93* (2006.01)
*H01L 21/00* (2006.01)
(Continued)

(52) U.S. Cl.
CPC ............ *H01L 29/93* (2013.01); *B81C 1/00976* (2013.01); *H01G 5/16* (2013.01);
(Continued)

(58) Field of Classification Search
CPC ...... H03B 5/1243; H03B 5/124; H01L 29/93; H01L 27/0808

USPC ............ 257/414, 415; 438/22–26, 48, 51–53; 361/277, 278, 281
See application file for complete search history.

(56) References Cited

U.S. PATENT DOCUMENTS 5,367,429 A 11/1994 Tsuchitani et al.
8,508,003 B2 * 8/2013 Yoshida ........................ 257/415
(Continued)

FOREIGN PATENT DOCUMENTS

JP H05-2976 A 1/1993
JP H05-172846 A 7/1993
(Continued)

OTHER PUBLICATIONS

International Search Report; PCT/JP2012/066500; Oct. 2, 2012.
(Continued)

*Primary Examiner* — Hsien Ming Lee
(74) *Attorney, Agent, or Firm* — Studebaker & Brackett PC (57) ABSTRACT

A variable capacitance device includes a fixed substrate, a movable portion, driving electrodes, an RF capacitance electrode and an insulating film. The movable portion faces the fixed substrate and can change a gap between the movable portion and the fixed substrate. The driving electrodes are formed on the fixed substrate so as to face the movable portion. The RF capacitance electrode is formed on the fixed substrate so as to face the movable portion and be spaced apart from the driving electrodes. The insulating film is formed between the movable portion and the driving electrodes. The level of a voltage applied to the driving electrodes and the level of a voltage applied to the movable portion are periodically switched and the level of a voltage applied to the RF capacitance electrode and the level of a voltage applied to the movable portion are always the same.

9 Claims, 8 Drawing Sheets

(51) Int. Cl.
*H01G 5/16* (2006.01)
*H01L 49/02* (2006.01)
*B81C 1/00* (2006.01)
*H01L 23/64* (2006.01)

(52) U.S. Cl.
CPC ............ *H01L 23/642* (2013.01); *H01L 28/60* (2013.01); *B81B 2201/0221* (2013.01); *H01L 2924/0002* (2013.01)

(56) References Cited

U.S. PATENT DOCUMENTS

| | | |
|---|---|---|
| 2004/0207456 A1 | 10/2004 | York |
| 2007/0181411 A1 | 8/2007 | Ikehashi et al. |
| 2009/0072630 A1 | 3/2009 | Miyazaki |
| 2010/0246087 A1 | 9/2010 | Ikehashi et al. |
| 2010/0328840 A1* | 12/2010 | Yamazaki .................... 361/281 |
| 2011/0115546 A1 | 5/2011 | Ikehashi et al. |

FOREIGN PATENT DOCUMENTS

| | | | |
|---|---|---|---|
| JP | 2003-039392 A | 2/2003 | |
| JP | 2005-508096 A | 3/2005 | |
| JP | 2009-070670 A | 4/2009 | |
| JP | 2009-212451 A | 9/2009 | |
| JP | 2010-280057 A | 12/2010 | |
| JP | 2011-042019 A | 3/2011 | |
| WO | WO 2011/152192 | * 12/2011 | ................ B81B 3/00 |

OTHER PUBLICATIONS

Written Opinion of the International Searching Authority; PCT/JP2012/066500; Oct. 2, 2012.

* cited by examiner

VARIABLE CAPACITANCE DEVICE

CROSS REFERENCE TO RELATED APPLICATIONS

This application claims benefit of priority to Japanese Patent Application No. 2011-244139 filed on Nov. 8, 2011, and to International Patent Application No. PCT/JP2012/066500 filed on Jun. 28, 2012, the entire content of each of which is incorporated herein by reference.

TECHNICAL FIELD

The present technical field relates to variable capacitance devices that utilize an electrostatic-driving-type actuator that is driven using an electrostatic force and that is capable of changing a radio frequency (RF) capacitance thereof.

BACKGROUND

In recent years, electrostatic-driving-type actuators that employ micro-electromechanical systems (MEMS) have sometimes been utilized in variable capacitance devices (for example, refer to Japanese Unexamined Patent Application Publication No. 2010-280057).

Figure 1:
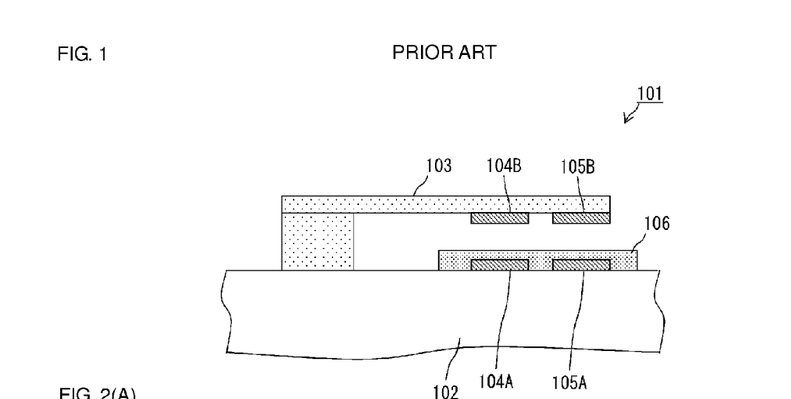
FIG. 1 is a diagram for explaining an example configuration of an electrostatic-driving-type actuator of the related art.

FIG. 1 is a diagram for explaining an example configuration of an electrostatic-driving-type actuator 101 of the related art that is included in a variable capacitance device.

As illustrated in FIG. 1, the electrostatic-driving-type actuator 101 includes a semiconductor substrate 102, an elastic member 103, a lower driving electrode 104A, an upper driving electrode 104B, a lower capacitance electrode 105A, an upper capacitance electrode 105B and an insulating film 106. The elastic member 103 is a movable portion composed of an insulating material and has one end thereof fixed to the semiconductor substrate 102. The lower driving electrode 104A and the lower capacitance electrode 105A are formed next to each other on the semiconductor substrate 102. The insulating film 106 is formed so as to cover the lower driving electrode 104A and the lower capacitance electrode 105A. The upper driving electrode 104B is formed on the elastic member 103 so as to face the lower driving electrode 104A. The upper capacitance electrode 105B is formed on the elastic member 103 so as to face the lower capacitance electrode 105A.

This electrostatic-driving-type actuator 101 is driven by applying a driving voltage (DC voltage) between the lower driving electrode 104A and the upper driving electrode 104B. Specifically, a driving capacitance is formed between the lower driving electrode 104A and the upper driving electrode 104B as a result of the driving voltage being applied between the lower driving electrode 104A and the upper driving electrode 104B. The elastic member 103 is drawn toward the semiconductor substrate 102 by electrostatic attraction due to the driving capacitance and the upper capacitance electrode 105B comes into contact with the insulating film 106. Thus, a first capacitance is formed between the upper capacitance electrode 105B and the lower capacitance electrode 105A. In addition, in a state where the electrostatic-driving-type actuator 101 is not being driven, a gap is formed between the upper capacitance electrode 105B and the insulating film 106. Consequently, a second capacitance, which has a smaller capacitance value than the first capacitance, is formed between the upper capacitance electrode 105B and the lower capacitance electrode 105A. Thus, the electrostatic-driving-type actuator 101 functions as a variable capacitance element.

A phenomenon called a sticking phenomenon sometimes occurs in this type of electrostatic-driving-type actuator. In more detail, the upper driving electrode also comes into contact with the insulating film when the upper capacitance electrode comes into contact with the insulating film when the electrostatic-driving-type actuator is driven. At such a time, charge may enter the insulating film due to there being a potential difference between the upper driving electrode and the lower driving electrode, the charge then becomes trapped in the insulating film, and as a result the insulating film is charged up (electrified). Then, even when application of the driving voltage is stopped, the upper driving electrode will still be drawn toward the insulating film due to the insulating film having been charged up. A phenomenon in which the elastic member does not move from a state of being drawn toward the semiconductor substrate for such a reason is called a sticking phenomenon, and when the sticking phenomenon occurs there is a problem in that the electrostatic-driving-type actuator can no longer be controlled.

Consequently, in the above-described electrostatic-driving-type actuator 101, when driving is performed, switching is performed between a state in which the lower driving electrode 104A is connected to ground while a driving voltage is applied to the upper driving electrode 104B and a state in which the upper driving electrode 104B is connected to ground while a driving voltage is applied to the lower driving electrode 104A (hereafter, this type of driving method is referred to as bipolar driving). Charging up of the insulating film 106 can be eliminated and occurrence of the sticking phenomenon can be prevented by performing such bipolar driving.

SUMMARY

Technical Problem

Here, a case will be considered in which the upper driving electrode and the upper capacitance electrode formed on the elastic member, which is a movable portion, in the above-described electrostatic-driving-type actuator 101, are formed as a single movable-portion-side electrode. In this case, it is difficult to control the displacement of the elastic member when a driving voltage is applied between the lower capacitance electrode and the movable-portion-side electrode and therefore it is appropriate to adopt a configuration in which the movable-portion-side electrode is connected to ground. In such a configuration, it is possible to prevent occurrence of the sticking phenomenon by using bipolar driving by switching the polarity of a driving voltage applied to the lower driving electrode between positive and negative.

However, in order to switch the polarity of the driving voltage applied to the lower driving electrode between positive and negative, a driving circuit is needed that is capable of generating a driving voltage of both positive and negative polarities. The circuit configuration of such a driving circuit would be more complex and expensive than that of a driving circuit that generates only a driving voltage of a single polarity. Consequently, the cost of the entire variable capacitance device is increased.

Accordingly, an object of the present disclosure is to realize a variable capacitance device that is capable of preventing occurrence of the sticking phenomenon by using bipolar driving and in which a circuit section thereof can be formed at low cost and easily.

Solution to Problem

A variable capacitance device of the present disclosure includes a fixed substrate, a movable beam, a fixed-substrateside driving electrode, a fixed-substrate-side capacitance electrode, a dielectric film and a circuit section. The movable beam includes a movable electrode that faces the fixed substrate and that can change a gap between the movable electrode and the fixed substrate. At least one fixed-substrate-side driving electrode is formed on the fixed substrate so as to face the movable electrode. The fixed-substrate-side capacitance electrode is formed on the fixed substrate so as to face the movable electrode and so as to be spaced apart from the fixed-substrate-side driving electrode. The dielectric film is formed between the movable electrode and the fixed-substrate-side driving electrode. The circuit section is formed such that a level of a voltage applied to the fixed-substrate-side driving electrode and a level of a voltage applied to the movable electrode are periodically switched and that a level of a voltage applied to the fixed-substrate-side capacitance electrode and the level of the voltage applied to the movable electrode are always the same.

With this configuration, the direction of an electric field acting on the dielectric film can be periodically inverted by performing bipolar driving such that the level of the voltage applied to the fixed-substrate-side driving electrode and the level of the voltage applied to the movable electrode are periodically switched. Consequently, the dielectric film is not charged up (electrified) and occurrence of the sticking phenomena can be prevented. In addition, generation of a potential difference between the fixed-substrate-side capacitance electrode and the movable electrode can be prevented and the amount of displacement of the movable beam can be prevented from being affected by a potential difference generated between the fixed-substrate-side capacitance electrode and the movable electrode by ensuring that the level of the voltage applied to the fixed-substrate-side capacitance electrode is the same as the level of the voltage applied to the movable electrode. As a result of periodically switching the level of the voltage applied to the fixed-substrate-side driving electrode and the level of the voltage applied to the movable electrode to voltages of different levels, the circuit section can be given a low-cost simple configuration rather than a sophisticated configuration for generating DC voltages of both positive and negative polarities.

In the above-described variable capacitance device, it is preferable that the circuit section include an RF cut resistor connected between the movable electrode and the fixed-substrate-side capacitance electrode. It is preferable that the RF cut resistor have an impedance that is larger than an impedance of an RF capacitance formed between the movable electrode and the fixed-substrate-side capacitance electrode. In particular, it is preferable that the RF cut resistor have an impedance that is 10 or more times the impedance of the RF capacitance formed between the movable electrode and the fixed-substrate-side capacitance electrode.

In this configuration, since the movable electrode and the fixed-substrate-side capacitance electrode are connected to each other via the RF cut resistor, the level of the voltage applied to the movable electrode and the level of the voltage applied to the fixed-substrate-side capacitance electrode are always the same and therefore it is possible to prevent a potential difference from being generated between the movable electrode and the fixed-substrate-side capacitance electrode. As a result, it is possible to prevent the amount of displacement of the movable beam from being affected by a potential difference between the movable electrode and the fixed-substrate-side capacitance electrode. In addition, an RF signal can be prevented from leaking into the circuit section connected between the movable electrode and the fixed-substrate-side capacitance electrode.

The above-described variable capacitance device preferably further includes a first RF signal terminal and a second RF signal terminal and the circuit section preferably includes a first DC cut capacitor connected between the movable electrode and the first RF signal terminal and a second DC cut capacitor connected between the fixed-substrate-side capacitance electrode and the second RF signal terminal. The first DC cut capacitor and the second DC cut capacitor each preferably have a capacitance that is larger than the RF capacitance formed between the movable electrode and the fixed-substrate-side capacitance electrode. In particular, the capacitance is preferably 20 or more times larger.

In this configuration, the movable electrode and the fixed-substrate-side capacitance electrode are connected to the RF signal terminal via the DC cut capacitor and therefore an external circuit connected to the RF signal terminal can be prevented from being affected by a DC component.

In the above-described variable capacitance device, it is preferable that the level of the voltage applied to the fixed-substrate-side driving electrode and the level of the voltage applied to the movable electrode are periodically switched between ground and a certain voltage level.

With this configuration, the circuit configuration can be made to be very simple by utilizing the ground and a certain voltage level.

The above-described variable capacitance device may further include a first RF signal terminal connected to the movable electrode and a second RF signal terminal connected to the fixed-substrate-side capacitance electrode, the circuit section may include a first DC cut capacitor connected between the movable electrode and the first RF signal terminal and a movable electrode driving-voltage-applying terminal that applies a direct current driving voltage to the movable electrode, and the circuit section may further include a first coil connected between the movable electrode driving-voltage-applying terminal and the movable electrode.

With this configuration, the time constant of returning of the voltage applied to the movable electrode when the direct-current driving voltage is switched is improved. Thus, the potential difference between the movable electrode and the fixed-substrate-side driving electrode generated when the driving voltage is switched instantaneously returns.

In the above-described variable capacitance device, the circuit section may include a second coil that is connected between the movable electrode driving-voltage-applying terminal and the fixed-substrate-side capacitance electrode.

Also with this configuration, the time constant of returning of the voltage when the direct current driving voltage is switched is improved. Thus, the potential difference between the movable electrode and the fixed-substrate-side driving electrode generated when the driving voltage is switched more instantaneously returns.

In the above-described variable capacitance device, the circuit section may include a third coil that is connected between the movable electrode and the fixed-substrate-side capacitance electrode.

With this configuration, a parallel resonance circuit is formed by a variable capacitance, which is formed between the movable electrode and the fixed-substrate-side capacitance electrode, and the third coil. Thus, the coil included in the resonant circuit whose resonant frequency is variable doubles as a DC cut coil and as a result the resonant circuit including the variable capacitance element can be formed in a compact size.

Advantageous Effects of Disclosure

According to the present disclosure, the direction of an electric field acting on the dielectric film can be periodically inverted by performing bipolar driving such that the level of the voltage applied to the fixed-substrate-side driving electrode and the level of the voltage applied to the movable electrode are periodically switched. Consequently, the dielectric film is not charged up (electrified) and occurrence of the sticking phenomena can be prevented. In addition, generation of a potential difference between the fixed-substrate-side capacitance electrode and the movable electrode can be prevented and the amount of displacement of the movable beam can be prevented from being affected by a potential difference generated between the fixed-substrate-side capacitance electrode and the movable electrode by ensuring that the level of the voltage applied to the fixed-substrate-side capacitance electrode is the same as the level of the voltage applied to the movable electrode. By periodically switching the level of the voltage applied to the fixed-substrate-side driving electrode and the level of the voltage applied to the movable electrode to voltages of different levels, the circuit section can be given a low-cost simple configuration rather than a sophisticated configuration for generating DC voltages of both positive and negative polarities.

DETAILED DESCRIPTION

Example configurations of variable capacitance devices according to embodiments of the present disclosure will be described with reference to the drawings. In some of the drawings, X-Y-Z axes of a Cartesian coordinate system are used in which a thickness direction of a movable beam of an electrostatic-driving-type actuator is a Z axis direction, a main axial direction of the movable beam is an X axis direction and a width direction of the movable beam is a Y axis direction.

First Embodiment

Figure 2A:
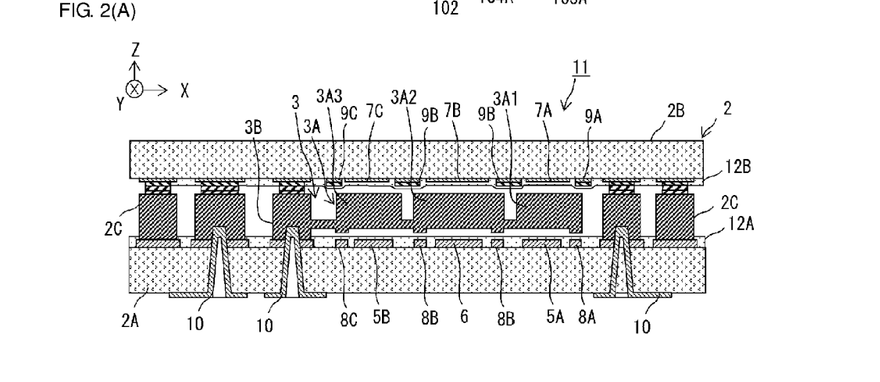
FIGS. 2(A) and 2(B) show diagrams for explaining an example configuration of an electrostatic-driving-type actuator included in a variable capacitance device according to a first embodiment of the present disclosure.

First, a variable capacitance device 1 according to a first embodiment of the present disclosure will be described. The variable capacitance device 1 according to this embodiment includes an electrostatic-driving-type actuator 11. In FIG. 2, the configuration of the electrostatic-driving-type actuator 11 included in the variable capacitance device 1 according to this embodiment is illustrated. FIG. 2(A) is a sectional view (X-Z plane sectional view) of the electrostatic-driving-type actuator 11 included in the variable capacitance device 1 according to the first embodiment of the present disclosure.

As illustrated in FIG. 2(A), the electrostatic-driving-type actuator 11 includes a casing 2, a movable beam 3, driving electrodes 5A and 5B, an RF capacitance electrode 6, driving electrodes 7A to 7C, same potential electrodes 8A to 8C and 9A to 9C, external connection electrodes 10 and insulating films 12A and 12B.

The casing 2 includes a fixed substrate 2A, a fixed substrate 2B and a frame 2C and has a space thereinside that is hermetically sealed. The hermetically sealed space inside the casing 2 is a low-pressure atmosphere (around 1000 Pa). The fixed substrate 2A and the fixed substrate 2B are insulating substrates composed of for example a glass or sapphire and have a rectangular shape when viewed in plan. The fixed substrate 2A and the fixed substrate 2B may instead be substrates composed of silicon. The frame 2C is composed of a metal such as Cu and has a rectangular annular shape when viewed in plan. The fixed substrate 2A, the fixed substrate 2B and the frame 2C are joined to each other with the frame 2C interposed therebetween, thereby forming the casing 2. The fixed substrate 2A is a first fixed substrate and the fixed substrate 2B is a second fixed substrate.

The movable beam 3 is composed of a metal such as Cu and is accommodated inside the casing 2. The movable beam 3 includes a movable portion 3A and an anchor portion 3B. The movable portion 3A is supported at one end thereof by the anchor portion 3B. The anchor portion 3B is a pillar-shaped region that is joined to the fixed substrate 2B and the fixed substrate 2A. Operation of the movable portion 3A will be described in detail later, but the movable portion 3A faces and is separated from both of the fixed substrate 2A and the fixed substrate 2B when driving is not being performed, and is displaced toward the fixed substrate 2A side or the fixed substrate 2B side when driving is being performed.

Figure 2B:
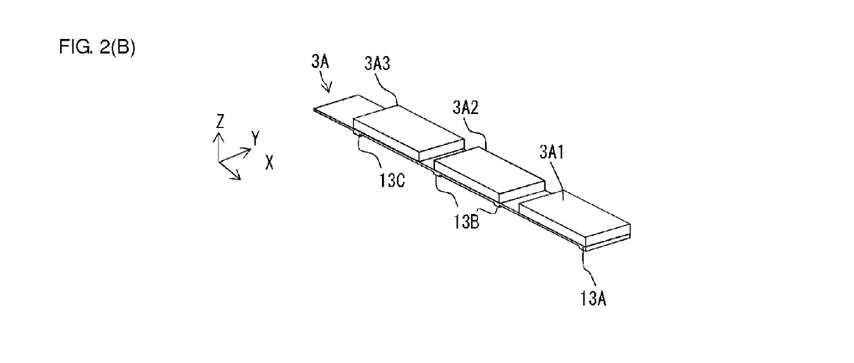

FIG. 2(B) is a perspective view of the movable portion 3A included in the electrostatic-driving-type actuator 11. As illustrated in FIG. 2(A) and FIG. 2(B), the movable portion 3A includes capacitance forming portions 3A1, 3A2 and 3A3. The capacitance forming portions 3A1, 3A2 and 3A3 are formed so as to be thick (around 10 μm), are arranged in order from the movable end side (positive side in X axis direction) toward the fixed end side (negative side in X axis direction), and are connected to each other via thin (around 3 μm) portions. A protruding portion 13A is provided on a surface of the capacitance forming portion 3A1 on the side facing the fixed substrate 2A. Protruding portions 13B are provided on a surface of the capacitance forming portion 3A2 on the side facing the fixed substrate 2A. A protruding portion 13C is provided on a surface of the capacitance forming portion 3A3 on the side facing the fixed substrate 2A. The movable portion 3A is a movable electrode obtained by forming a moveable-portion-side driving capacitance electrode and a movable-portion-side RF capacitance electrode in an integrated manner.

The driving electrodes 5A and 5B, the RF capacitance electrode 6 and the same potential electrodes 8A to 8C are formed on a surface of the fixed substrate 2A on a side that faces the movable beam 3. In addition, the insulating film 12A is formed on a surface of the fixed substrate 2A on the side facing the movable beam 3 so as to cover the driving electrodes 5A and 5B, the RF capacitance electrode 6 and the same potential electrodes 8A to 8C.

The driving electrodes 5A and 5B are electrodes that are each connected to driving terminals DC-12 and DC-22, which will be described later, and are fixed-substrate-side driving electrodes. The driving electrode 5A is provided at a position that faces the capacitance forming portion 3A1. The driving electrode 5B is provided at a position that faces the capacitance forming portion 3A3. The RF capacitance electrode 6 is an electrode connected to an RF signal output terminal RF-OUT, which will be described later, and is a fixed-substrate-side capacitance electrode. The RF capacitance electrode 6 is provided at a position facing the capacitance forming portion 3A2. The same potential electrodes 8A to 8C are electrodes that are at the same potential as the movable beam 3. The same potential electrode 8A is provided at a position facing the protruding portion 13A of the capacitance forming portion 3A1. The same potential electrode 8B is provided at a position facing the protruding portion 13B of the capacitance forming portion 3A2. The same potential electrode 8C is provided at a position facing the protruding portion 13C of the capacitance forming portion 3A3.

The driving electrodes 5A and 5B and the RF capacitance electrode 6 preferably have low resistance. Accordingly, the driving electrodes 5A and 5B, the RF capacitance electrode 6 and the same potential electrodes 8A to 8C are composed of metals where a metal having a low resistivity such as Cu, Au, Al, W and so forth is a main component. In addition, the driving electrodes 5A and 5B, the RF capacitance electrode 6 and the same potential electrodes 8A to 8C are formed with a thickness of 0.5 to 2.0 μm.

The protruding portions 13A to 13C provided on the movable portion 3A contact the insulating film 12A when the movable portion 3A is displaced toward the fixed substrate 2A side. At this time, regions of the insulating film 12A formed over the driving electrodes 5A and 5B and the RF capacitance electrode 6 do not contact the movable portion 3A. Thus, charging up (electrification) of the regions of the insulating film 12A formed over the driving electrodes 5A and 5B and the RF capacitance electrode 6 is suppressed. In addition, regions of the insulating film 12A that contact the protruding portions 13A to 13C are regions of the insulating film 12A formed over the same potential electrodes 8A to 8C and are at the same potential as the protruding portions 13A to 13C and the same potential electrodes 8A to 8C due to being positioned between the protruding portions 13A to 13C and the same potential electrodes 8A to 8C. Thus, charging up of the regions of the insulating film 12A formed over the same potential electrodes 8A to 8C can also be suppressed.

The driving electrodes 7A to 7C and the same potential electrodes 9A to 9C are formed on a surface of the fixed substrate 2B on the side facing the movable beam 3. In addition, the insulating film 12B is formed on a surface of the fixed substrate 2B on the side facing the movable beam 3 so as to cover the driving electrodes 7A to 7C and the same potential electrodes 9A to 9C.

The driving electrodes 7A to 7C are electrodes that are each connected to driving terminals DC-11 and DC-21, which will be described later, and are fixed-substrate-side driving electrodes. The driving electrode 7A is provided at a position that faces the capacitance forming portion 3A1. The driving electrode 7B is provided at a position that faces the capacitance forming portion 3A2. The driving electrode 7C is provided at a position that faces the capacitance forming portion 3A3. Here, the driving electrodes 7A to 7C are formed with a thickness of 50 to 500 nm.

The same potential electrodes 9A to 9C are electrodes that are at the same potential as the movable beam 3. The same potential electrode 9A is provided so as to face an end portion of the capacitance forming portion 3A1 on the positive side in the X axis direction. The same potential electrodes 9B are provided so as to face an end portion of the capacitance forming portion 3A1 on the negative side in the X axis direction, an end portion of the capacitance forming portion 3A2 on the positive side in the X axis direction, an end portion of the capacitance forming portion 3A2 on the negative side in the X axis direction and an end portion of the capacitance forming portion 3A3 on the positive side in the X axis direction. The same potential electrode 9C is provided so as to face an end portion of the capacitance forming portion 3A3 on the negative side in the X axis direction. Here, the same potential electrodes 9A to 9C are thicker than the driving electrodes 7A to 7C and are formed with a thickness of 100 to 1000 nm. Consequently, regions of the insulating film 12B formed over the same potential electrodes 9A to 9C protrude more than regions adjacent thereto. Therefore, when the movable portion 3A is displaced toward the fixed substrate 2B side, only the regions of the insulating film 12B formed over the same potential electrodes 9A to 9C contact the movable portion 3A, and regions of the insulating film 12B formed over the driving electrodes 7A to 7C do not contact the movable portion 3A. Thus, charging up of the regions of the insulating film 12B formed over the driving electrodes 7A to 7C is also suppressed. In addition, regions of the insulating film 12B formed over the same potential electrodes 9A to 9C are at the same potential as the movable portion 3A and the same potential electrodes 9A to 9C as a result of being positioned between the movable portion 3A and the same potential electrodes 9A to 9C. Thus, charging up of the regions of the insulating film 12B formed over the same potential electrodes 9A to 9C is also suppressed.

The external connection electrodes 10 are formed on a lower surface of the fixed substrate 2A and are used for mounting the electrostatic-driving-type actuator 11. The external connection electrodes 10 are connected to electrodes and the movable beam 3 inside the casing 2 via through electrodes provided in the fixed substrate 2A.

The insulating film 12A and the insulating film 12B are composed of for example SiN or $SiO_2$ and correspond to a dielectric film of this embodiment. The insulating film 12A is provided so as to prevent the driving electrodes 5A and 5B, the RF capacitance electrode 6 and the same potential electrodes 8A to 8C from directly contacting the movable portion 3A and causing a short circuit, and is also provided to protect these electrodes. The insulating film 12B is provided so as to prevent the driving electrodes 7A to 7C and the same potential electrodes 9A to 9C from directly contacting the movable portion 3A and causing a short circuit, and is also provided to protect these electrodes.

Next, the circuit configuration of the variable capacitance device 1 including an equivalent circuit of the electrostatic-driving-type actuator 11 will be described.

Figure 3:
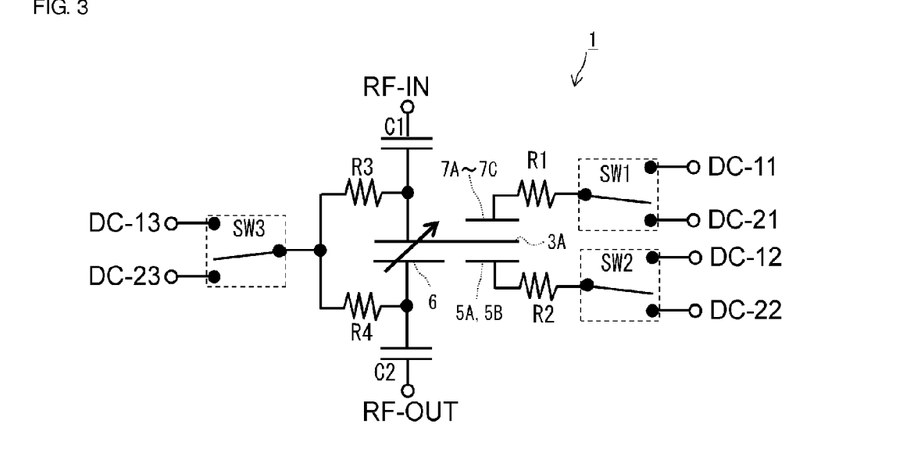
FIG. 3 is a circuit diagram of the variable capacitance device according to the first embodiment of the present disclosure.

FIG. 3 is a circuit diagram of the variable capacitance device 1 according to the first embodiment of the present disclosure. The variable capacitance device 1 according to the first embodiment of the present disclosure includes a circuit section that drives the electrostatic-driving-type actuator 11.

The movable portion 3A is connected to an RF signal input terminal RF-IN via a DC cut capacitor C1. The RF signal input terminal RF-IN is a first RF signal terminal. The RF capacitance electrode 6 is connected to the RF signal output terminal RF-OUT via a DC cut capacitor C2. The RF signal output terminal RF-OUT is a second RF signal terminal. In addition, the driving electrodes 7A to 7C are connected to a switch SW1 via an RF cut resistor R1. The driving electrodes 5A and 5B are connected to a switch SW2 via an RF cut resistor R2. A connection point between the movable portion 3A and the DC cut capacitor C1 is connected to a switch SW3 via an RF cut resistor R3. A connection point between the RF capacitance electrode 6 and the DC cut capacitor C2 is connected to the switch SW3 via an RF cut resistor R4. The switch SW1 is selectively connectable to the first driving terminal DC-11 or the second driving terminal DC-21. The switch SW2 is selectively connectable to the first driving terminal DC-12 or the second driving terminal DC-22. The switch SW3 is selectively connectable to the first driving terminal DC-13 or the second driving terminal DC-23. The switches SW1, SW2 and SW3 may be formed so as to be respectively selectively connectable to the first driving terminals DC-11, DC-12 and DC-13 or to ground (DC 0V).

The DC cut capacitor C1 has for example a capacitance of 100 pF and is provided in order to prevent a DC component from leaking through the RF signal input terminal RF-IN. The DC cut capacitor C2 has for example a capacitance of 100 pF and is provided in order to prevent a DC component from leaking through the RF signal output terminal RF-OUT. The RF cut resistor R1 has for example a resistance of 200 kΩ and is provided in order to prevent an RF signal from leaking through the driving terminals DC-11 and DC-21 via the switch SW1. The RF cut resistor R2 has for example a resistance of 200 KΩ and is provided in order to prevent an RF signal from leaking through the driving terminals DC-12 and DC-22 via the switch SW2. The RF cut resistors R3 and R4 each have for example a resistance of 200 kΩ and are provided in order to prevent an RF signal from leaking through the driving terminals DC-13 and DC-23 via the switch SW3.

When explaining basic operations in this circuit configuration, control will be performed to realize a state in which the movable portion 3A is displaced toward the fixed substrate 2A side or a state in which the movable portion 3A is displaced toward the fixed substrate 2B side.

In order to realize a state in which the movable portion 3A is displaced toward the fixed substrate 2A side, a driving voltage is applied such that a potential difference is generated between the movable portion 3A and the driving electrodes 5A and 5B and the switches SW1, SW2 and SW3 are switched such that the movable portion 3A and the driving electrodes 7A to 7C come to have the same potential. As a result, a driving capacitance is formed between the movable portion 3A and the driving electrodes 5A and 5B and the movable portion 3A is displaced toward the fixed substrate 2A side by electrostatic attraction due to this driving capacitance. Consequently, the distance between the movable portion 3A and the RF capacitance electrode 6 is reduced to the minimum and the RF capacitance formed between the movable portion 3A and the RF capacitance electrode 6 becomes maximum.

In addition, in order to realize a state in which the movable portion 3A is displaced toward the fixed substrate 2B side, a driving voltage is applied such that a potential difference is generated between the movable portion 3A and the driving electrodes 7A to 7C and the switches SW1, SW2 and SW3 are switched such that the movable portion 3A and the driving electrodes 5A and 5B come to have the same potential. As a result, a driving capacitance is formed between the movable portion 3A and the driving electrodes 7A to 7C and the movable portion 3A is displaced toward the fixed substrate 2B side by electrostatic attraction due to this driving capacitance. Consequently, the distance between the movable portion 3A and the RF capacitance electrode 6 is increased to the maximum and the RF capacitance formed between the movable portion 3A and the RF capacitance electrode 6 becomes minimum.

Next, specific switching operations performed when the variable capacitance device 1 is driven will be described. The variable capacitance device 1 is subjected to bipolar driving so as to switch between a first switching operation and a second switching operation while maintaining a state in which the movable portion 3A is displaced in a state in which the movable portion 3A is displaced toward the fixed substrate 2A side or a state in which the movable portion 3A is displaced toward the fixed substrate 2B side.

Figure 4A:
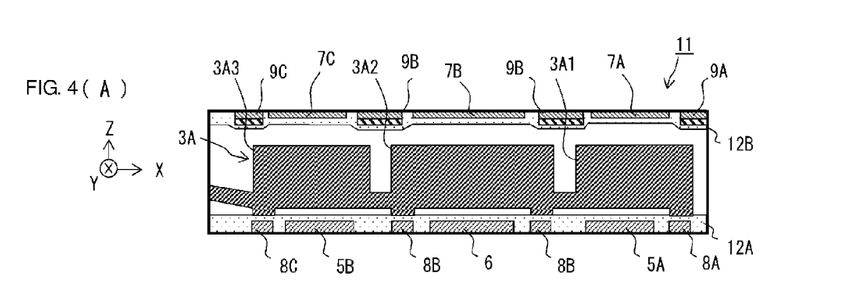
FIGS. 4(A), 4(B) and 4(C) show diagrams for explaining a time when an RF capacitance is maximum in the variable capacitance device according to the first embodiment of the present disclosure.
Figure 4B:
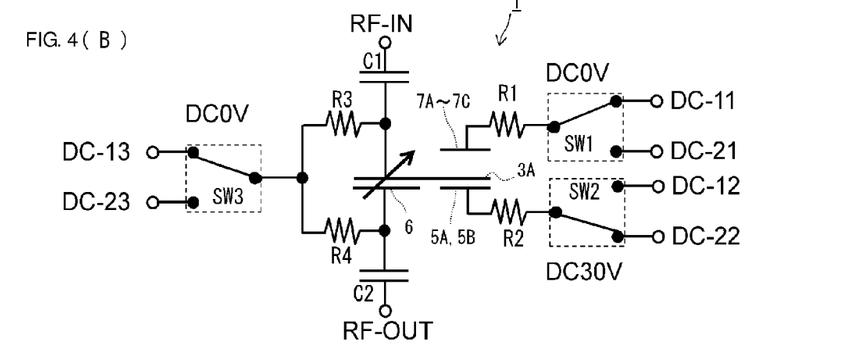
Figure 4C:
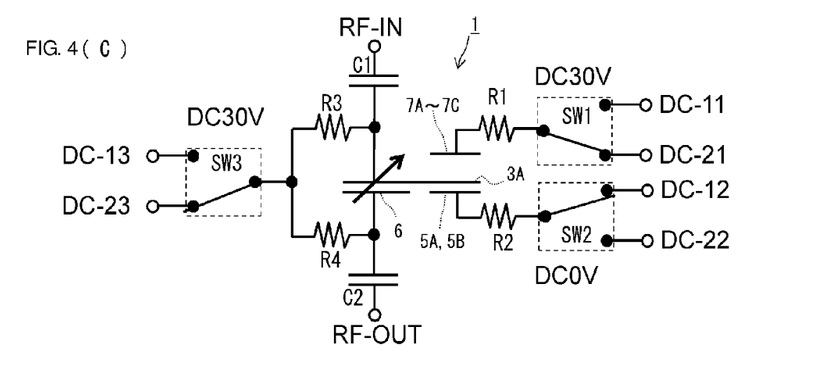

FIG. 4 shows diagrams for explaining a time when an RF capacitance is maximum in the variable capacitance device 1 according to the first embodiment of the present disclosure. FIG. 4(A) is a partial enlarged sectional view illustrating an internal space of the casing 2 in a state where the movable portion 3A is displaced toward the fixed substrate 2A side. FIG. 4(B) is a circuit diagram for explaining the first switching operation in a state where the movable portion 3A is displaced toward the fixed substrate 2A side. FIG. 4(C) is a circuit diagram for explaining the second switching operation in a state where the movable portion 3A is displaced toward the fixed substrate 2A side. In addition, in order to facilitate ease of understanding of bipolar driving, here, a circuit is illustrated in which it is assumed that DC 0 V is applied to the first driving terminals DC-11, DC-12 and DC-13 and DC 30 V is applied to the second driving terminals DC-21, DC-22 and DC-23.

The variable capacitance device 1 performs the first switching operation to realize a state in which the movable portion 3A is displaced toward the fixed substrate 2A side. Specifically, in the variable capacitance device 1, the switch SW1 is connected to the first driving terminal DC-11 (DC 0 V), the switch SW3 is connected to the first driving terminal DC-13 (DC 0 V) and the switch SW2 is connected to the second driving terminal DC-22 (DC 30 V) in the first switching operation. Consequently, a potential difference is not generated between the driving electrodes 7A to 7C and the movable portion 3A, and a potential difference of DC 30 V is generated between the driving electrodes 5A and 5B and the movable portion 3A. Therefore, a driving capacitance is formed between the movable portion 3A and the driving electrodes 5A and 5B and the movable portion 3A is displaced toward the fixed substrate 2A side by an electrostatic attraction due to this driving capacitance. Consequently, the distance between the movable portion 3A and the RF capacitance electrode 6 is reduced to the minimum and the RF capacitance formed between the movable portion 3A and the RF capacitance electrode 6 becomes maximum.

In the variable capacitance device 1, the second switching operation is performed after the first switching operation is performed as described above. Specifically, in the variable capacitance device 1, the switch SW1 is connected to the second driving terminal DC-21 (DC 30 V), the switch SW3 is connected to the second driving terminal DC-23 (DC 30 V) and the switch SW2 is connected to the first driving terminal DC-12 (DC 0 V) in the second switching operation in a state where the movable portion 3A is displaced toward the fixed substrate 2A side. Consequently, a potential difference is not generated between the driving electrodes 7A to 7C and the movable portion 3A, and a potential difference of DC 30 V is generated between the driving electrodes 5A and 5B and the movable portion 3A. Therefore, a driving capacitance is formed between the movable portion 3A and the driving electrodes 5A and 5B and a state in which the movable portion 3A is displaced toward the fixed substrate 2A side by electrostatic attraction due to this driving capacitance is maintained. At this time as well, the distance between the movable portion 3A and the RF capacitance electrode 6 is at the minimum and the RF capacitance formed between the movable portion 3A and the RF capacitance electrode 6 remains maximum.

In this way, after the second switching operation is performed, the first switching operation is performed again, and so on, and the first switching operation and the second switching operation are switching between with a constant period in a state in which the movable portion 3A is displaced toward the fixed substrate 2A side and as a result the direction of an electric field acting on the insulating film 12A can be inverted with a constant period while maintaining the state in which the movable portion is displaced toward the fixed substrate 2A side. Thus, a charge is not trapped in the insulating film 12A and therefore the insulating film 12A is not charged up (electrified) and occurrence of the sticking phenomenon can be prevented with more certainty.

Figure 5A:
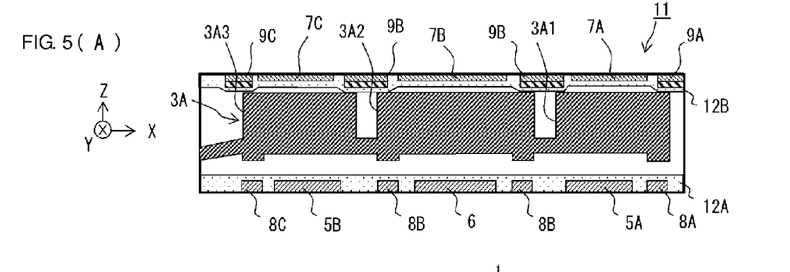
FIGS. 5(A), 5(B) and 5(C) show diagrams for explaining a time when an RF capacitance is minimum in the variable capacitance device according to the first embodiment of the present disclosure.
Figure 5B:
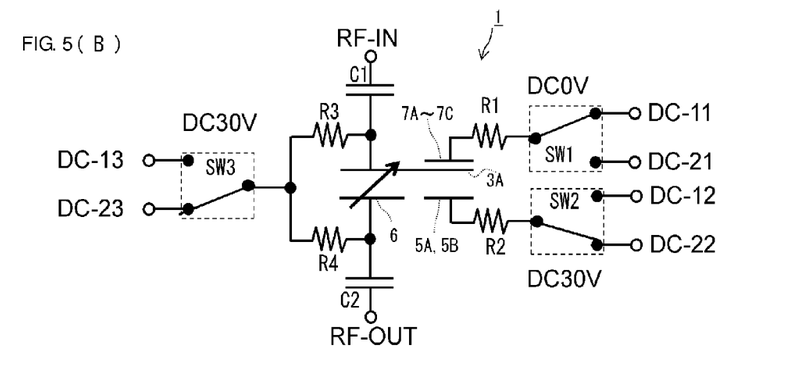
Figure 5C:
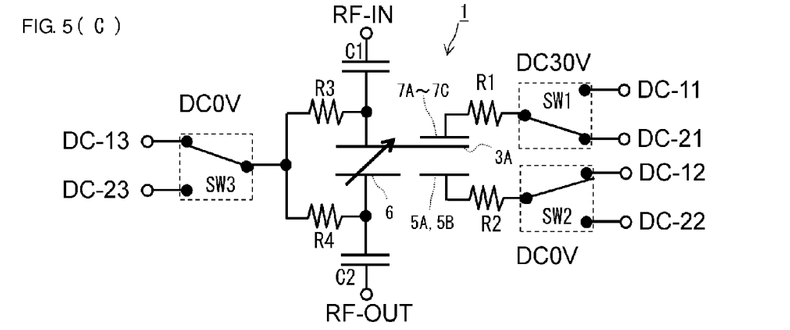

FIG. 5 shows diagrams for explaining a time when an RF capacitance is minimal in the variable capacitance device 1 according to the first embodiment of the present disclosure. FIG. 5(A) is a partial enlarged sectional view illustrating an internal space of the casing 2 in a state where the movable portion 3A is displaced toward the fixed substrate 2B side. FIG. 5(B) is a circuit diagram for explaining a first switching operation in a state where the movable portion 3A is displaced toward the fixed substrate 2B side. FIG. 5(C) is a circuit diagram for explaining a second switching operation in a state where the movable portion 3A is displaced toward the fixed substrate 2B side. Here as well, a circuit is illustrated in which it is assumed that DC 0 V is applied to the first driving terminals DC-11, DC-12 and DC-13, and DC 30 V is applied to the second driving terminals DC-21, DC-22 and DC-23.

The variable capacitance device 1 performs the first switching operation in order to realize a state where the movable portion 3A is displaced toward the fixed substrate 2B side. Specifically, in the variable capacitance device 1, the switch SW2 is connected to the second driving terminal DC-22 (DC 30 V), the switch SW3 is connected to the second driving terminal DC-23 (DC 30 V) and the switch SW1 is connected to the first driving terminal DC-11 (DC 0 V) in the first switching operation. Consequently a potential difference is not generated between the driving electrodes 5A and 5B and the movable portion 3A, and a potential difference of DC 30 V is generated between the driving electrodes 7A to 7C and the movable portion 3A. Therefore, a driving capacitance is formed between the movable portion 3A and the driving electrodes 7A to 7C and the movable portion 3A is displaced toward the fixed substrate 2B side by an electrostatic attraction due to this driving capacitance. Thus, the distance between the movable portion 3A and the RF capacitance electrode 6 is increased to the maximum and the RF capacitance formed between the movable portion 3A and the RF capacitance electrode 6 becomes minimal.

In the variable capacitance device 1, the second switching operation is performed after the first switching operation is performed as described above. Specifically, in the variable capacitance device 1, the switch SW2 is connected to the first driving terminal DC-12 (DC 0 V), the switch SW3 is connected to the first driving terminal DC-13 (DC 0 V) and the switch SW1 is connected to the second driving terminal DC-21 (DC 30 V) in the second switching operation in a state where the movable portion 3A is displaced toward the fixed substrate 2B side. Consequently a potential difference is not generated between the driving electrodes 5A and 5B and the movable portion 3A, and a potential difference of DC 30 V is generated between the driving electrodes 7A to 7C and the movable portion 3A. Therefore, a driving capacitance is formed between the movable portion 3A and the driving electrodes 7A to 7C and a state in which the movable portion 3A is displaced toward the fixed substrate 2B side by an electrostatic attraction due to this driving capacitance being maintained. At this time as well, the distance between the movable portion 3A and the RF capacitance electrode 6 is at the maximum and the RF capacitance formed between the movable portion 3A and the RF capacitance electrode 6 remains minimal.

In this way, after the second switching operation is performed, the first switching operation is performed again and so on, and the first switching operation and the second switching operation are switched between a constant period in a state in which the movable portion 3A is displaced toward the fixed substrate 2B side, and as a result the direction of an electric field acting on the insulating film 12B can be inverted with a constant period while maintaining a state in which the movable portion 3A is displaced toward the fixed substrate 2B side. Thus, charge is not trapped in the insulating film 12B and therefore the insulating film 12B is not charged up (electrified) and occurrence of the sticking phenomenon can be prevented with more certainty.

Thus, the variable capacitance device 1 of this embodiment can prevent the sticking phenomenon from occurring by performing bipolar driving such that driving voltages applied to the movable portion 3A, the driving electrodes 5A and 5B and the driving electrodes 7A to 7C in a state of driving are not fixed but are rather alternately switched between driving voltages of different levels. Consequently, there is no need for a sophisticated driving circuit generating a DC voltage of both positive and negative polarities, a driving circuit that is low cost and simple can be utilized and the manufacturing cost of the variable capacitance device 1 as a whole can be reduced.

By switching between the first switching operation and the second switching operation with a constant period, the driving voltage applied to the movable portion 3A is alternately switched between DC 30 V and DC 0 V, but since the level of the voltage applied to the RF capacitance electrode 6 and the level of the voltage applied to the movable portion 3A are always the same as a result of the movable portion 3A and the RF capacitance electrode 6 being connected to each other via the RF cut resistors R3 and R4, a potential difference can be prevented from occurring between the movable portion 3A and the RF capacitance electrode 6. Thus, the amount of displacement of the movable portion 3A can be prevented from being affected by a potential difference between the movable portion 3A and the RF capacitance electrode 6. In addition, it is preferable that the impedance of the RF cut resistors R3 and R4 be larger than the impedance of the RF capacitance formed between the movable portion 3A and the RF capacitance electrode 6 in order to reduce an RF signal leaking through the driving terminals DC-1 and DC-2. In particular, the RF cut resistors R3 and R4 preferably have an impedance that is ten or more times the impedance of the RF capacitance formed between the movable portion 3A and the RF capacitance electrode 6.

In addition, there is a possibility of a DC component affecting an external circuit connected to the RF signal input terminal RF-IN or the RF signal output terminal RF-OUT, but here, since such a DC component is removed by the DC cut capacitors C1 and C2 as a result of the movable portion 3A and the RF capacitance electrode 6 being connected to the RF signal input terminal RF-IN or the RF signal output terminal RF-OUT via the DC cut capacitor C1 or C2, such an effect on an external circuit connected to the RF signal input terminal RF-IN or the RF signal output terminal RF-OUT is prevented. In addition, the RF capacitance of the variable capacitance device 1 is affected by the provision of the DC cut capacitors C1 and C2, but this effect can be suppressed by making the capacitances of the DC cut capacitors C1 and C2 be larger than the RF capacitance formed between the movable portion 3A and the RF capacitance electrode 6. Preferably, if the capacitances of the DC cut capacitors C1 and C2 are made to be twenty or more times the maximum value of the RF capacitance formed between the movable portion 3A and the RF capacitance electrode 6, the effect due to provision of the DC cut capacitors C1 and C2 can be made so small as to be able to be ignored.

In addition, secondarily, due to the fact that the movable portion 3A and the RF capacitance electrode 6 are connected to each other via the RF cut resistors R3 and R4, even if a charge due to electrostatic discharge (ESD) is applied to the RF capacitance electrode 6 or the movable portion 3A, the charge rapidly moves through the RF cut resistors R3 and R4 and ESD damage of the variable capacitance device 1 can be prevented and a high ESD tolerance can be realized.

Second Embodiment

Next, a variable capacitance device 21 according to a second embodiment of the present disclosure will be described. Description will be made while denoting parts that are the same as those described in the first embodiment of the present disclosure with the same reference symbols.

In the variable capacitance device 1 according to the above-described first embodiment, displacement of the movable portion 3A toward the fixed substrate 2A side is realized by a driving capacitance formed between the driving electrodes 5A and 5B and the movable portion 3A and displacement of the movable portion 3A toward the fixed substrate 2B side is realized by a driving capacitance formed between the driving electrodes 7A to 7C and the movable portion 3A, whereas, in the variable capacitance device 21 according to this embodiment, displacement of the movable portion 3A toward the fixed substrate 2A side is realized by a driving capacitance formed between the driving electrodes 5A and 5B and the movable portion 3A and displacement of the movable portion 3A to a state in which the movable portion 3A is separated from and faces both the fixed substrate 2A and the fixed substrate 2B is realized by an elastic force possessed by the movable body 3A. In other words, the variable capacitance device 21 according to this embodiment has a configuration realized by removing the driving electrodes 7A to 7C, the same potential electrodes 9A to 9C, the insulating film 12B, the RF cut resistor R1, the switch SW1 and so forth from the variable capacitance device 1 according to the first embodiment.

Figure 6:
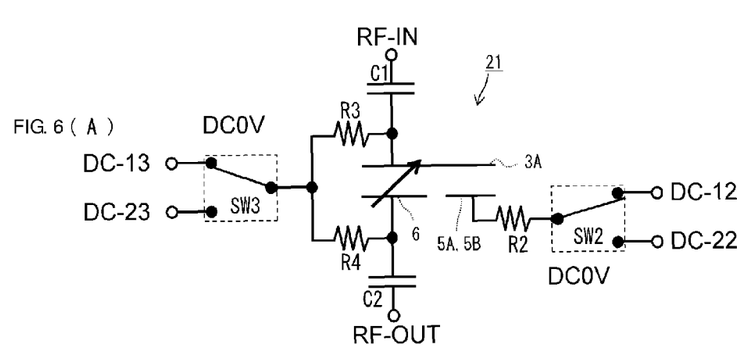
FIGS. 6(A), 6(B) and 6(C) show circuit diagrams for a variable capacitance device according to a second embodiment of the present disclosure.

FIG. 6 shows diagrams for explaining a time when driving is being performed and a time when driving is not being performed in the variable capacitance device 21 according to the second embodiment of the present disclosure. Here as well, a circuit is illustrated in which it is assumed that DC 0 V is applied to the first driving terminals DC-12 and DC-13, and DC 30 V is applied to the second driving terminals DC-22 and DC-23. FIG. 6(A) is a circuit diagram for explaining a switching state of the variable capacitance device 21 of this embodiment at a time when driving is not being performed.

In the variable capacitance device 21, at a time when driving is not being performed, the switches SW2 and SW3 are connected to the first driving terminals DC-12 and DC-13 (DC 0 V) and the movable portion 3A faces and is separated from both of the fixed substrate 2A and the fixed substrate 2B due to the elastic force possessed by the movable portion 3A. Therefore, the distance between the movable portion 3A and the RF capacitance electrode 6 is at the maximum and the RF capacitance formed between the movable portion 3A and the RF capacitance electrode 6 is at a minimum.

FIG. 6(B) is a circuit diagram for explaining a first switching operation of the variable capacitance device 21 of this embodiment at a time when driving is being performed.

The variable capacitance device 21 performs the first switching operation in order to realize a state in which the movable portion 3A is displaced toward the fixed substrate 2A side at a time when driving is being performed. Specifically, in the variable capacitance device 21, the switch SW2 is connected to the first driving terminal DC-12 (DC 0 V) and the switch SW3 is connected to the second driving terminal DC-23 (DC 30 V) in the first switching operation. Accordingly, a potential difference of DC 30 V is generated between the driving electrodes 5A and 5B and the movable portion 3A. Therefore, a driving capacitance is formed between the movable portion 3A and the driving electrodes 5A and 5B and the movable portion 3A is displaced toward the fixed substrate 2A side by an electrostatic attraction due to this driving capacitance. Consequently, the distance between the movable portion 3A and the RF capacitance electrode 6 is reduced to the minimum and the RF capacitance formed between the movable portion 3A and the RF capacitance electrode 6 becomes a maximum.

FIG. 6(C) is a circuit diagram for explaining a second switching operation of the variable capacitance device 21 of this embodiment at a time when driving is being performed.

In the variable capacitance device 21, the second switching operation is performed after the first switching operation is performed as described above. Specifically, in the variable capacitance device 21, the switch SW2 is connected to the second driving terminal DC-22 (30 V) and the switch SW3 is connected to the first driving terminal DC-13 (DC 0 V) in the second switching operation in a state where the movable portion 3A is displaced toward the fixed substrate 2A side. Accordingly, a potential difference of DC 30 V is generated between the driving electrodes 5A and 5B and the movable portion 3A. Therefore, a driving capacitance is formed between the movable portion 3A and the driving electrodes 5A and 5B and a state in which the movable portion 3A is displaced toward the fixed substrate 2A side by electrostatic attraction due to this driving capacitance is maintained. At this time as well, the distance between the movable portion 3A and the RF capacitance electrode 6 is at the minimum and the RF capacitance formed between the movable portion 3A and the RF capacitance electrode 6 remains at the maximum.

In this way, after the second switching operation is performed, the first switching operation is performed again and so on, and the first switching operation and the second switching operation are switched between with a constant period in a state in which the movable portion 3A is displaced toward the fixed substrate 2A side, and as a result the direction of an electric field acting on the insulating film 12A can be inverted with a constant period while maintaining a state in which the movable portion 3A is displaced toward the fixed substrate 2A side. Thus, charge is not trapped in the insulating film 12A and therefore the insulating film 12A is not charged up (electrified) and occurrence of the sticking phenomenon can be prevented with more certainty.

Third Embodiment

Next, a variable capacitance device 31 according to a third embodiment of the present disclosure will be described. Description will be made while denoting parts that are the same as those described in the first embodiment of the present disclosure with the same reference symbols.

Figure 7:
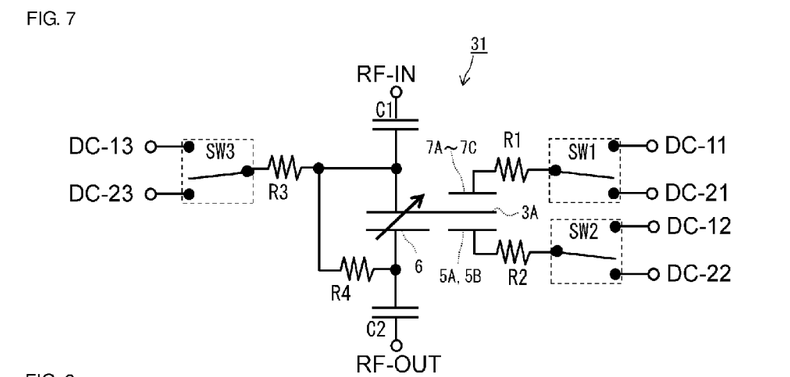
FIG. 7 is a circuit diagram of a variable capacitance device according to a third embodiment of the present disclosure.

FIG. 7 is a circuit diagram of the variable capacitance device 31 according to the third embodiment of the present disclosure. In the variable capacitance device 31 of this embodiment, the position of the RF cut resistor R3 is different to that in the above-described first embodiment. Specifically, a connection point between the movable portion 3A and the DC cut capacitor C1 is connected to a connection point between the RF capacitance electrode 6 and the DC cut capacitor C2 via the RF cut resistor R4. The connection point between the movable portion 3A and the DC cut capacitor C1 is connected to the switch SW3 via the RF cut resistor R3. The switch SW3 is selectively connectable to the first driving terminal DC-13 or the second driving terminal DC-23.

Also with this circuit configuration, generation of the sticking phenomenon can be prevented by performing bipolar driving similarly to as in the first embodiment.

Fourth Embodiment

Figure 8:
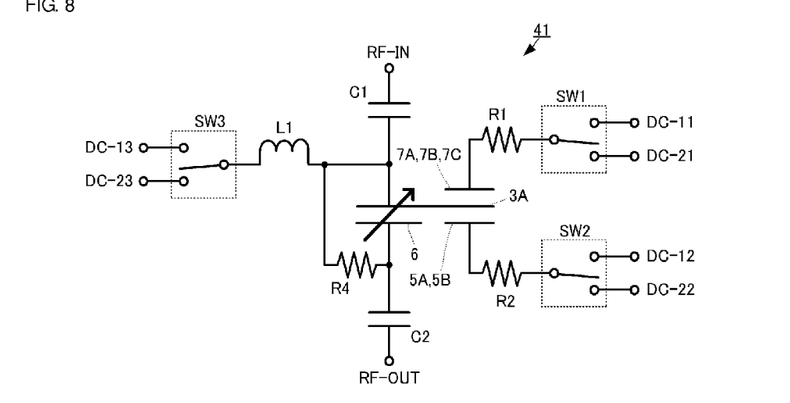
FIG. 8 is a circuit diagram of a variable capacitance device according to a fourth embodiment of the present disclosure.

Next, a variable capacitance device 41 according to a fourth embodiment of the present disclosure will be described. FIG. 8 is a circuit diagram of the variable capacitance device 41 according to the fourth embodiment of the present disclosure. The variable capacitance device 41 of this embodiment has the same configuration as the variable capacitance device 1 described in the first embodiment except that the RF cut resistor R3 is omitted and a coil L1 is inserted between the switch SW3 and the movable portion 3A. Therefore, only this difference will be specifically described.

More specifically, the coil L1 is connected between a connection point between the movable portion 3A and the DC cut capacitor C1, and the switch SW3. At this time, the coil L1 is connected on the switch SW3 side of the connection point between the movable portion 3A and the RF cut resistor R4. The inductance of the coil L1 may be for example around ten or more times the impedance based on the capacitance realized by the variable capacitance device. Thus, the coil L1 sufficiently functions as an RF cut element. For example, if combined with the example circuit configuration of any of the above-described embodiments, the inductance may be on the order of 20 nH to 30 nH. The coil L1 corresponds to a first coil of the present disclosure.

Figure 9:
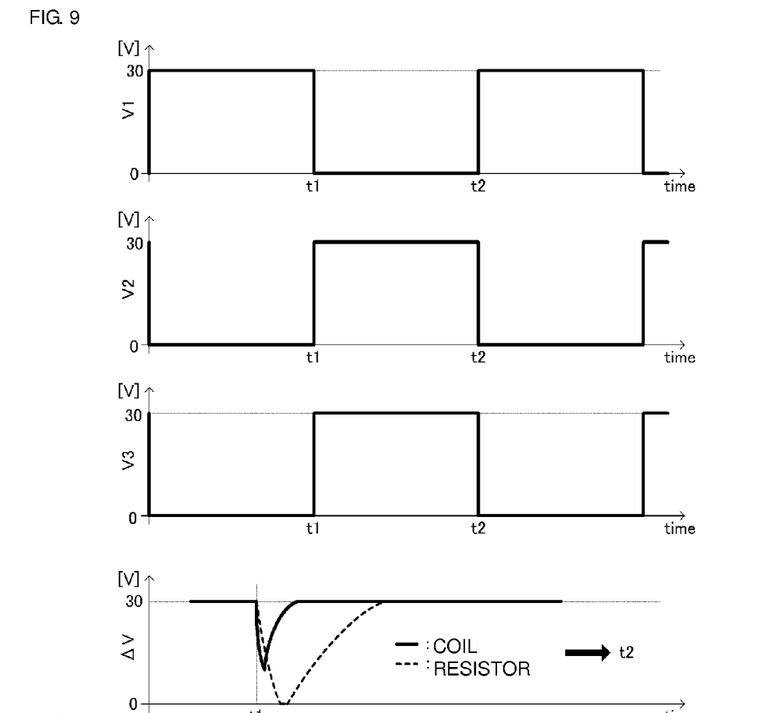
FIG. 9 illustrates voltage waveforms during a switching operation at multiple points in a variable capacitance device.

The following further operational effect can be obtained by adopting this configuration. FIG. 9 illustrates voltage waveforms at the time of a switching operation at multiple points in the variable capacitance device. V1 represents a voltage applied from the switch SW1. V2 represents a voltage applied from the switch SW2. V3 represents a voltage applied from the switch SW3. ΔV represents a potential difference between the movable portion 3A and the driving electrodes 5A and 5B. In the graph of ΔV, the solid line represents the case in which the configuration of this embodiment is adopted (case in which coil L1 is used) and the broken line represents the case in which the configuration of the first embodiment is adopted (case in which RF cut resistor R3 is used).

As described above, in the case where an applied voltage is switched by a switching operation, a voltage V3 applied from the switch SW3 undergoes a transition in accordance with a time constant determined by a circuit element connected between the switch SW3 and the RF signal input terminal RF-IN.

In the configuration of the first embodiment, the RF cut resistor R3 and the DC cut capacitor C1 are connected in series with each other between the switch SW3 and the RF signal input terminal RF-IN. It is preferable that the RF cut resistor R3 have a certain resistance or more in order to retain the above-described RF cut function. In addition, it is also preferable that the DC cut capacitor C1 have a certain capacitance or more in order to not affect the capacitance realized by the variable capacitance device. Therefore, the time constant becomes larger. Therefore, as illustrated by the broken line in the characteristics diagram of ΔV, at the timing of switching, ΔV takes a certain amount of time to decrease from 30 V to 0 V and then return to 30 V. For example, with the above-described example circuit configuration, ΔV returns on the order of msec.

In the configuration of this embodiment, the RF cut resistor R3 has been replaced by the coil L1 and the impedance of the coil L1 is set to be a certain value or more. Therefore, the time constant of the above-mentioned V3 can be reduced. Thus, as illustrated in FIG. 9, ΔV returns instantaneously. For example, with the above-described circuit configuration, it returns on the order of 1 nsec.

Thus, by adopting the configuration of this embodiment, the speed of returning of the potential difference ΔV at the time of switching can be made high. That is, the reduction period becomes shorter such that the potential difference ΔV is for example 0 V.

Figure 10:
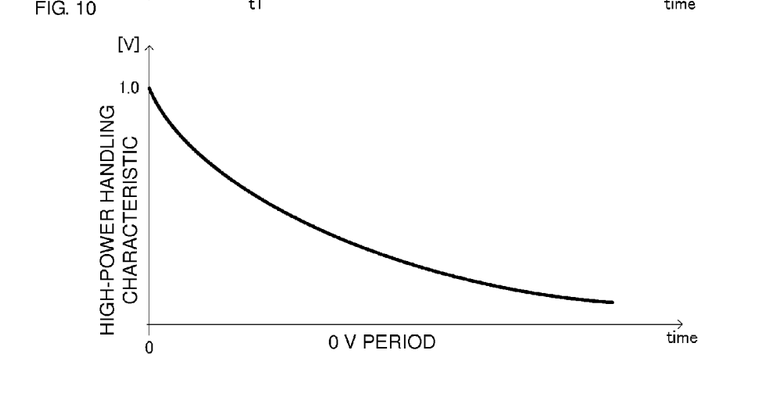
FIG. 10 illustrates a high-power handling characteristic of a variable capacitance device.

FIG. 10 illustrates a high-power handling characteristic of a variable capacitance device. In FIG. 10, the horizontal axis represents a continuous period at 0 V and the vertical axis represents a high-power handling characteristic.

In the case where an electrostatic attraction continuously does not act between the driving electrodes 5A and 5B and the movable body 3A, that is, a direct current potential difference is not provided, as the voltage of an applied RF signal increases, self actuation in which the gap between the RF capacitance electrode 6 and the movable body 3A becomes larger occurs and the capacitance changes. The high-power handling characteristic represents the maximum RF voltage at which there is no self activation with respect to a period in which a direct current potential difference is not provided.

As illustrated in FIG. 10, the shorter the 0 V period, that is, the shorter the period in which a certain direct current potential difference is not provided, the higher the maximum RF voltage.

With the configuration of this embodiment, a period in which a certain direct current potential difference is not provided can be made shorter than in the configuration of the third embodiment. Thus, in the configuration of this embodiment, the high-power handling characteristic can be improved. That is, a variable capacitance device that can be utilized up to a higher RF voltage can be realized.

Fifth Embodiment

Figure 11:
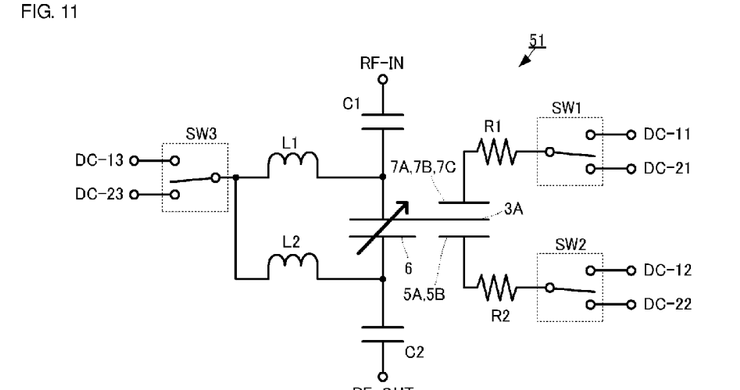
FIG. 11 is a circuit diagram of a variable capacitance device according to a fifth embodiment of the present disclosure.

Next, a variable capacitance device 51 according to a fifth embodiment of the present disclosure will be described. FIG. 11 is a circuit diagram of the variable capacitance device 51 according to the fifth embodiment of the present disclosure. The variable capacitance device 51 of this embodiment has the same configuration as the variable capacitance device 41 described in the fourth embodiment except that the RF cut resistor R4 is removed and a new coil L2 is added. Therefore, only this difference will be specifically described.

More specifically, the coil L2 is connected between a connection point between the RF capacitance electrode 6 and the DC cut capacitor C2, and the switch SW3. At this time, the coil L2 is arranged such that one end thereof is connected to the switch SW3 and the other end thereof is connected to a connection point between the RF capacitance electrode 6 and the DC cut capacitor C2. The inductance of the coil L2 is determined in a similar way to that of the coil L1. The coil L2 corresponds to a second coil of the present disclosure.

Also with this configuration, a variable capacitance device having an excellent high-power handling characteristic similarly to the variable capacitance device 41 of the fourth embodiment can be realized.

Sixth Embodiment

Figure 12:
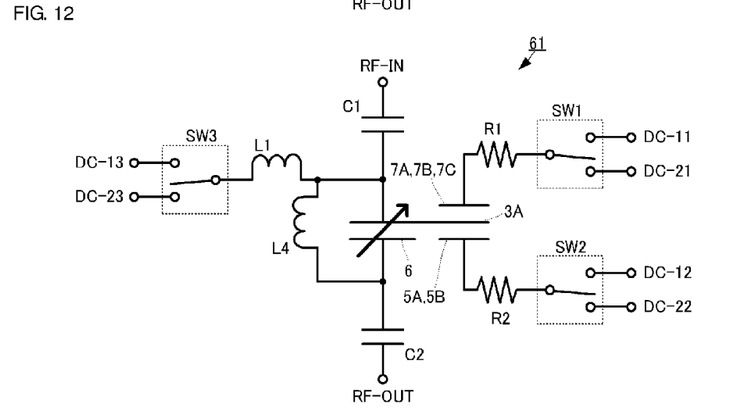
FIG. 12 is a circuit diagram of a variable capacitance device according to a sixth embodiment of the present disclosure.

Next, a variable capacitance device 61 according to a sixth embodiment of the present disclosure will be described. FIG. 12 is a circuit diagram of the variable capacitance device 61 according to the sixth embodiment of the present disclosure. The variable capacitance device 61 of this embodiment has the same configuration as the variable capacitance device 41 described in the fourth embodiment except that the RF cut resistor R4 is replaced with a coil L3.

The inductance of the coil L3 is determined in a similar way to that of the coil L1. The coil L3 corresponds to a third coil of the present disclosure.

Also with this configuration, a variable capacitance device having an excellent high-power handling characteristic similar to the variable capacitance device 41 of the fourth embodiment can be realized.

In addition, in the configuration of this embodiment, a parallel LC resonant circuit can be realized by the capacitance varying portion formed of the RF capacitance electrode 6 and the movable portion 3A, and the coil L3.

Thus, the coil L3 can function as a coil for RF cutting and also double as a constituent element of a parallel LC resonant circuit. Thus, a variable-characteristic resonance circuit including the variable capacitance device can be realized in a compact size.

The present disclosure can be implemented as described in each of the above-described embodiments, but the same potential electrodes and the protruding portions need not necessarily be provided, and in such a case, occurrence of the sticking phenomena can still be suppressed by bipolar driving.

In addition, the RF cut resistors R1 to R4, the coils L1, L2 and L3, and the DC cut capacitors C1 and C2 may be formed as chip components, or may be formed of wiring lines and electrodes provided on the fixed substrate 2A or the fixed substrate 2B. In addition, switching of the switches SW1 to SW3 may be performed by using control signals from the outside, or a switching control IC may be mounted in the variable capacitance device 1.

The present disclosure is not limited to the description given in the above-described embodiments, and it is intended that equivalents to the scope of the claims and all modifications that are within the scope of the claims be included within the scope of the present disclosure.

The invention claimed is:
1. A variable capacitance device comprising:
a fixed substrate;
a movable beam that includes a movable electrode that faces the fixed substrate and changes a gap between the movable electrode and the fixed substrate;
at least one fixed-substrate-side driving electrode that is formed on the fixed substrate so as to face the movable electrode;
a fixed-substrate-side capacitance electrode that is formed on the fixed substrate so as to face the movable electrode and so as to be spaced apart from the fixed-substrate-side driving electrode;
a dielectric film formed between the movable electrode and the fixed-substrate-side driving electrode; and
a circuit section that is formed such that a level of a voltage applied to the fixed-substrate-side driving electrode and a level of a voltage applied to the movable electrode are periodically switched and that a level of a voltage applied to the fixed-substrate-side capacitance electrode and the level of the voltage applied to the movable electrode are always the same.

2. The variable capacitance device according to claim 1, wherein the circuit section includes an RF cut resistor that is connected between the movable electrode and the fixed-substrate-side capacitance electrode.

3. The variable capacitance device according to claim 2, wherein the RF cut resistor has an impedance that is larger than an impedance of an RF capacitance formed between the movable electrode and the fixed-substrate-side capacitance electrode.

4. The variable capacitance device according to claim 1, further comprising a first RF signal terminal and a second RF signal terminal,
wherein, the circuit section includes a first DC cut capacitor connected between the movable electrode and the first RF signal terminal and a second DC cut capacitor connected between the fixed-substrate-side capacitance electrode and the second RF signal terminal.

5. The variable capacitance device according to claim 4, wherein the first DC cut capacitor and the second DC cut capacitor each have a capacitance that is larger than the RF capacitance formed between the movable electrode and the fixed-substrate-side capacitance electrode.

6. The variable capacitance device according to claim 1, wherein the level of the voltage applied to the fixed-substrate-side driving electrode and the level of the voltage applied to the movable electrode are periodically switched between ground and a certain voltage level.

7. The variable capacitance device according to claim 1, further comprising a first RF signal terminal connected to the movable electrode and a second RF signal terminal connected to the fixed-substrate-side capacitance electrode,
wherein the circuit section includes a first DC cut capacitor connected between the movable electrode and the first RF signal terminal,
a movable electrode driving-voltage-applying terminal that applies a direct current driving voltage to the movable electrode,
and a first coil connected between the movable electrode driving-voltage-applying terminal and the movable electrode.

8. The variable capacitance device according to claim 7, wherein the circuit section includes a second coil that is connected between the movable electrode driving-voltage-applying terminal and the fixed-substrate-side capacitance electrode.

9. The variable capacitance device according to claim 7, wherein the circuit section includes a third coil that is connected between the movable electrode and the fixed-substrate-side capacitance electrode.

* * * * *